US012763383B2

(12) United States Patent
Khenkin

(10) Patent No.: US 12,763,383 B2
(45) Date of Patent: Oct. 13, 2026

(54) PORTABLE ELECTRONIC DEVICE BATTERY TESTING

(71) Applicant: Cirrus Logic International Semiconductor Ltd., Edinburgh (GB)

(72) Inventor: Aleksey S. Khenkin, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 356 days.

(21) Appl. No.: 18/352,754

(22) Filed: Jul. 14, 2023

(65) Prior Publication Data

US 2024/0291054 A1 Aug. 29, 2024

Related U.S. Application Data

(60) Provisional application No. 63/448,720, filed on Feb. 28, 2023.

(51) Int. Cl.

| | |
|---|---|
| ***H01M 10/42*** | (2006.01) |
| ***G01R 31/367*** | (2019.01) |
| ***G01R 31/385*** | (2019.01) |
| ***G01R 31/389*** | (2019.01) |
| ***G01R 31/392*** | (2019.01) |

(52) U.S. Cl.

CPC ...... *H01M 10/4285* (2013.01); *G01R 31/367* (2019.01); *G01R 31/385* (2019.01); *G01R 31/389* (2019.01); *G01R 31/392* (2019.01)

(58) Field of Classification Search

CPC ............. H01M 10/4285; G01R 31/385; G01R 31/389; G01R 31/392; G01R 31/367

USPC ...................... 324/500, 600, 76.11, 415–430

See application file for complete search history.

(56) References Cited

U.S. PATENT DOCUMENTS

| | | | | |
|---|---|---|---|---|
| 10,247,783 | B2 | 4/2019 | Mensah-Brown | |
| 11,973,202 | B2 * | 4/2024 | Bertness | B60L 53/60 |
| 12,130,333 | B2 * | 10/2024 | O'Mahony | B60L 58/16 |
| 2005/0218902 | A1 * | 10/2005 | Restaino | G01R 31/3648 324/433 |
| 2018/0164383 | A1 * | 6/2018 | Hsieh | H01M 10/486 |
| 2018/0323481 | A1 * | 11/2018 | Tsai | G01R 19/16542 |
| 2019/0094189 | A1 * | 3/2019 | Hsieh | G01N 29/12 |
| 2020/0412159 | A1 * | 12/2020 | Snyder | H01M 10/482 |
| 2021/0197691 | A1 | 7/2021 | Stefanopoulou et al. | |
| 2022/0155374 | A1 * | 5/2022 | Moon | G01R 31/3842 |
| 2022/0302733 | A1 * | 9/2022 | Howlett, III | H02J 7/80 |
| 2022/0376517 | A1 * | 11/2022 | Konopka | H02J 7/52 |
| 2022/0413054 | A1 * | 12/2022 | O'Mahony | G01R 31/385 |
| 2023/0122362 | A1 * | 4/2023 | Shoa Hassani Lashidani | G01R 31/3648 702/63 |

* cited by examiner

*Primary Examiner* — Huy Q Phan
*Assistant Examiner* — Trung Q Nguyen
(74) *Attorney, Agent, or Firm* — Jackson Walker L.L.P.

(57) ABSTRACT

A method of testing a battery of a portable electronic device, the method implemented by the portable electronic device or battery-testing apparatus thereof, the method comprising: applying a measurement signal to at least one terminal of the battery, wherein the measurement signal is a fluctuating or alternating electrical signal; and obtaining a measurement of a mechanical response of the battery to the measurement signal from a sensor.

18 Claims, 6 Drawing Sheets

PORTABLE ELECTRONIC DEVICE BATTERY TESTING

FIELD OF DISCLOSURE

The present disclosure relates in general to battery testing, and in particular to a method of testing a battery of a portable electronic device and associated apparatuses and systems.

BACKGROUND

Portable electronic devices are typically powered by batteries and may be referred to as battery-powered devices. Example portable electronic devices include cellphones, laptops, tablet computers, wearable electronic devices and power tools. Such devices may be referred to as consumer devices. Batteries for such portable electronic devices may comprise one or more battery cells, and references herein to such batteries may be considered references to the battery cell or cells concerned.

The batteries of such portable electronic devices are typically rechargeable. Portable electronic devices therefore generally comprise an onboard charger for controlling charging of their battery, with power being provided from an external power supply such as an external battery or mains power supply via a wired or wireless connection. The onboard charger may monitor battery characteristics including temperature, battery terminal voltage VB (such as battery open-circuit voltage OCV) and State-of-Charge (SOC) and control the charging rate of the battery according to a charge profile which is dependent on those characteristics. Lithium (Li) batteries, as an example, are typically charged at different charge rates depending on the temperature of the battery and on how full or empty the battery is in terms of charge (i.e. the State-of-Charge, SOC).

Such rechargeable batteries can degrade over time and even exhibit dangerous deterioration. An example of such deterioration is battery/cell swelling. Battery swelling is particularly important where the battery is enclosed within the portable electronic device casing/enclosure, for example as is typical for a cellphone. When the battery is enclosed in this way, battery swelling may develop and/or persist undetected presenting an ongoing risk. When the battery is constrained within the device casing, the swelling may damage or compromise the enclosure or outer pouch of the battery itself, potentially leading to the leaking of dangerous chemicals.

It is desirable to address the above problems.

SUMMARY

According to a first aspect of the present disclosure, there is provided a method of testing a battery of a portable electronic device, the method implemented by the portable electronic device or battery-testing apparatus thereof, the method comprising: applying a measurement signal to at least one terminal of the battery, wherein the measurement signal is a fluctuating or alternating electrical signal; and obtaining a measurement of a mechanical response of the battery to the measurement signal from a sensor.

According to a second aspect of the present disclosure, there is provided a method of testing a battery of a portable electronic device, the method implemented by the portable electronic device, the method comprising: applying a fluctuating or alternating electrical signal to at least one terminal of the battery; and obtaining a measurement of a mechanical response of the battery to the applied signal from a sensor.

According to a third aspect of the present disclosure, there is provided a method of testing a battery of a portable electronic device, the method comprising: applying a measurement signal to at least one terminal of the battery, wherein the measurement signal is a fluctuating or alternating electrical signal; and obtaining a measurement of a mechanical response of the battery to the measurement signal from a sensor.

According to a fourth aspect of the present disclosure, there is provided battery-testing apparatus for use by a portable electronic device to test a battery of the portable electronic device, the apparatus configured to carry out the method of any of the preceding aspects, optionally wherein the apparatus is implemented as a single integrated circuit or as a group of integrated circuits communicatively coupled together. According to a fifth aspect of the present disclosure, there is provided a portable electronic device comprising the battery-testing apparatus according to the aforementioned fourth aspect, and optionally comprising the battery. The portable electronic device may be a cellphone, laptop, tablet computer, wearable electronic device, power tool or other personal device.

Corresponding apparatus/device aspects, method aspects, computer program aspects and storage medium aspects are envisaged. Features of one aspect may be applied to another and vice versa.

BRIEF DESCRIPTION OF THE DRAWINGS

Reference will now be made, by way of example only, to the accompanying drawings, of which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

The inventors have considered that it is desirable to test a battery when it is in use (i.e. installed) in a portable electronic device, with the testing preferably carried out by the portable electronic device (consumer device) itself. Such testing may be referred to as in-situ testing, and may involve diagnosing a state of the battery, characterizing the battery, or analysing the battery, based on results of the testing. In this regard, a system and method for in-situ cell diagnostics is proposed. For example, it may be desirable to detect battery swelling, or other battery characteristics such as battery type (e.g. make and model), through such testing.

In overview, a battery (or cell) driven by an alternating or fluctuating (or variable or varying) electrical signal, such as an AC electrical signal, generates a mechanical response, i.e., a vibrational response. This mechanical response can be detected and measured by one or more sensors (e.g. external to the battery but potentially of the portable electronic device). For example, the mechanical response may be detected and measured across a wide frequency range or at particular frequencies. The results of such measurement may then be employed to detect and characterize various features of the response, e.g., peaks, plateaus, slopes, that can be used for diagnostics and/or interventions in battery performance.

As an example, in relation to in-situ swelling diagnostics, mechanical responses of new/healthy batteries may be measured as a reference, and responses of known bad/swollen batteries may also be measured for comparison purposes. Detection thresholds may then be established, to identify potential swelling (or to distinguish between swollen and non-swollen cells), based on the measured responses. Thresholds may be established to distinguish between levels of swelling, e.g., less than or more than a critical degree of swelling. Such thresholds may then be applied to the response for a battery of unknown status, to determine whether the battery is likely subject to swelling or to a critical degree of swelling.

Figure 1:
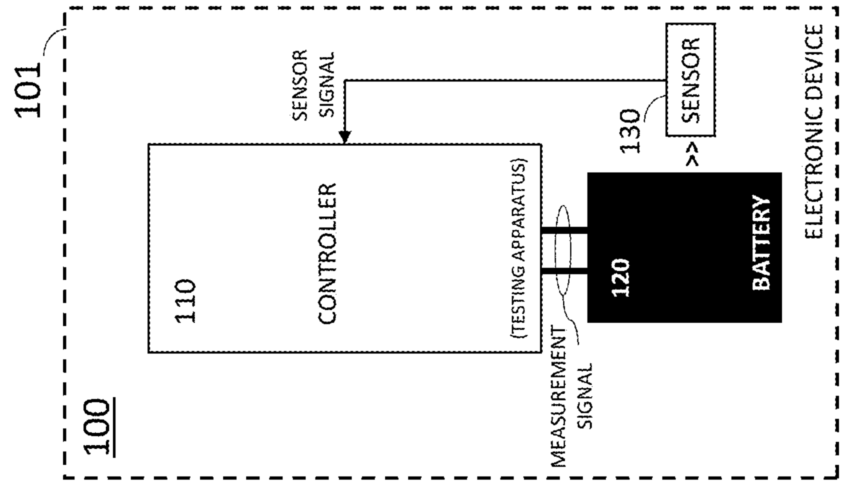
FIG. 1 is a schematic diagram of a portable electronic device embodying the present invention.

FIG. 1 is a schematic diagram of a portable electronic device 100, embodying the present invention. The portable electronic device 100 (an electrical or electronic device) may be referred to as a battery-powered device or host device. The portable electronic device 100 may be a consumer device. Examples of such devices include a mobile telephone or cellphone, a smartphone, an audio player, a video player, a PDA, a mobile computing platform such as a laptop computer or tablet, a games device, a wearable electronic device and a power tool.

As shown in FIG. 1, the device 100 may comprise an enclosure 101, a controller 110, a battery 120 and a sensor 130. The device 100 may be provided without the battery 120 and be fitted with the battery 120 subsequently. As such, the battery 120 may be a consumer battery.

Figure 2:
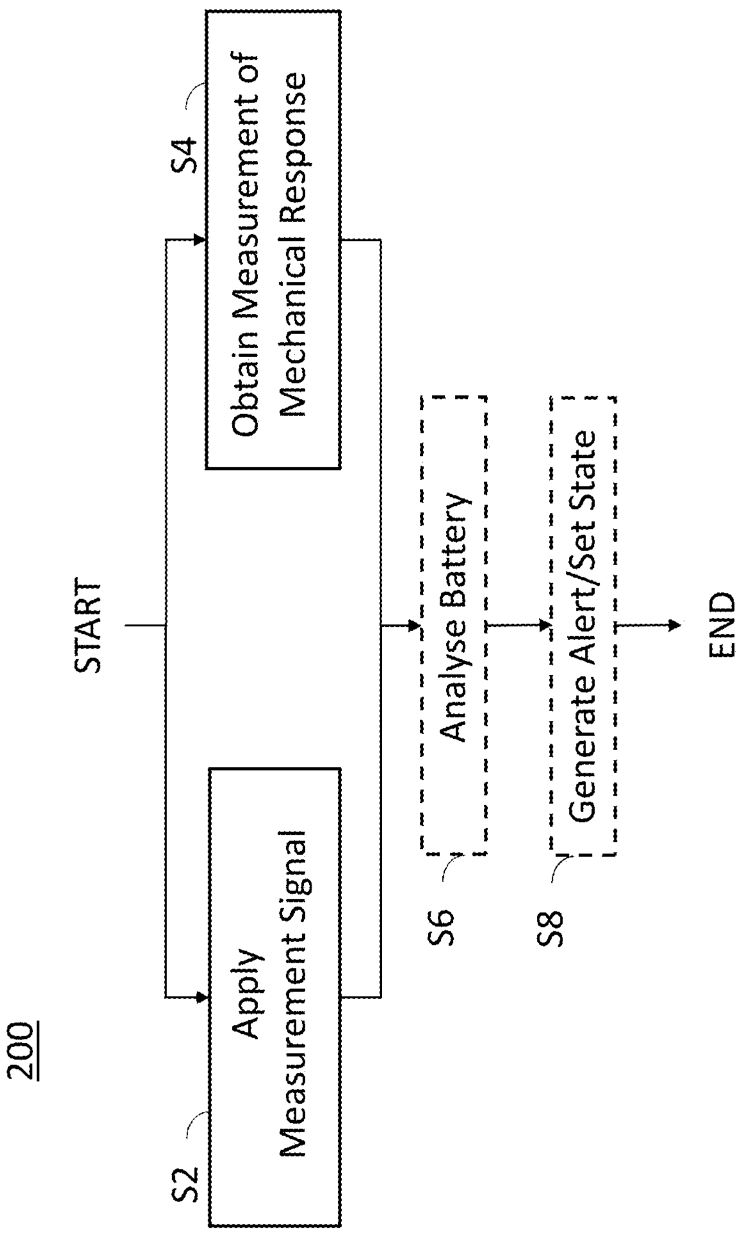
FIG. 2 is a flow diagram of a method embodying the present invention, which may be implemented in a portable electronic device.

The controller 110 is configured to test the battery and may be referred to as testing apparatus. FIG. 2 is a flow diagram of a method 200 of testing the battery 120, embodying the present invention. Method 200 may be implemented in the portable electronic device 100, at least partly in the controller 110 (i.e., the testing apparatus).

In some arrangements, the controller 110 may also be an onboard charger for controlling charging of the battery 120. Power may be provided from an external power supply such as an external battery or mains power supply via a wired or wireless connection (not shown). The controller 110 may monitor battery characteristics including any of temperature T, battery capacity C, VB, OCV and SOC. The controller 110 may control the charging rate of the battery according to a charge profile which is dependent on one or more of those characteristics.

The enclosure 101 may comprise any suitable housing, casing, chassis or other enclosure for housing the various components of the device 100. Enclosure 101 may be constructed from plastic, metal, and/or any other suitable materials. In addition, enclosure 101 may in some arrangements be adapted (e.g., sized and shaped) such that device 100 is readily transported by a user (i.e. a person, a consumer).

The controller 110 may be housed within enclosure 101 and may include any system, device, or apparatus configured to control testing of the battery according to method 200, and optionally other functionality of the device 100 including charging of the battery 120.

Control functionality of the controller 110 may be implemented as digital or analogue circuitry, in hardware or in software running on a processor, or in any combination of these. Such control functionality may include any system, device, or apparatus configured to interpret and/or execute program instructions or code and/or process data, and may include, without limitation a processor, microprocessor, microcontroller, digital signal processor (DSP), application specific integrated circuit (ASIC), FPGA (Field Programmable Gate Array) or any other digital or analogue circuitry configured to interpret and/or execute program instructions and/or process data. Thus the code may comprise program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware. Processor control code for execution may be provided on a non-volatile carrier medium such as a disk, CD- or DVD-ROM, programmed memory such as read only memory (Firmware), or on a data carrier such as an optical or electrical signal carrier. Such control circuitry and may be provided as, or as part of, an integrated circuit such as an IC chip.

Although not shown in FIG. 1, the device 100 may comprise a further controller separate from the controller 110 but in communication therewith, such as an application processor configured to generally control operation of the device 100. Alternatively, the functionality of such a further controller may be provided by the controller 110. The device 100 may also comprise an input and/or output unit (I/O unit), for interaction with a user and/or with another device, and a memory. The memory may be configured to retain program instructions and/or data for a period of time, e.g. for the controller 110 (and any further controller).

The battery 120 may be a lithium battery or other rechargeable battery comprising positive and negative electrodes, connected to corresponding terminals of the battery, and an electrolyte.

Turning to FIG. 2, method 200 may be implemented at least partly in the controller 110 of the device 100 and comprises steps S2 and S4 as shown. Method 200 may also comprise step S6 and potentially also step S8.

In step S2, a measurement signal is applied to at least one terminal of the battery, for example by the controller 110. That is, the measurement signal may be applied to the terminal(s) of the battery 120 by battery-testing apparatus of the portable electronic device 100. Step S2 may comprise generating the measurement signal; the controller 110 may generate the measurement signal and apply the measurement signal to the battery 120.

The measurement signal may be a fluctuating or alternating (or varying) electrical signal, and thus may induce a fluctuating or alternating electric field between electrodes of the battery. The measurement signal may induce a fluctuating or alternating potential difference across the terminals of the battery. The measurement signal may be an AC signal and may be a voltage signal or a current signal. The measurement signal is configured to induce a (measurable or detectable) mechanical response of the battery, such as a vibrational response.

Step S4 comprises obtaining a measurement of the mechanical response of the battery to the measurement signal from the sensor 130. Steps S2 and S4 may therefore be carried out in parallel, simultaneously or concurrently. Method 200 may comprise obtaining the measurement of the mechanical response of the battery 120 to the measurement signal while applying the measurement signal.

The sensor 130 may be any sensor capable of detecting the mechanical response of the battery 120 to the measurement signal and generating a sensor signal indicative of the mechanical response. For example, the sensor 130 may comprise at least one of: a microphone; an accelerometer, an inertial measurement unit, a motion sensor; a speaker; a piezoelectric sensor; a force sensor; a virtual button implemented by a force sensor; and an electromechanical actuator such as an LRA.

The sensor 130 is shown in FIG. 1 as being a sensor of the device 100, coupled to the battery such that it senses the mechanical response, and providing its sensor signal to the controller 110. The controller 110 in this way receives information (a vibrational response) from the sensor output indicative of the mechanical response, which may be used for example to affect the charging profile of the battery 120. The skilled person will understand that any of the above example sensors may be provided within or on the enclosure 101 of the device 100 such that they pick up the mechanical response. The sensor 130 may be mechanically coupled directly to the battery or to a part of the device 100 to which the battery is (directly) mechanically coupled when in use. The sensor 130 may be coupled to the battery 120 via mechanical linkage provided by structural components of the (host) device 100. The sensor 130 may be coupled to the battery by a combination of parts of the device 100 and air. Of course, the sensor 130 may be provided separately from the device 100, e.g., in separate testing equipment. Where the sensor 130 is provided separately, the device 100 (in particular the controller 110) may be configured to receive the sensor signal from the sensor 130.

Many factors may affect the mechanical response of the battery 120 to the measurement signal. For example, the mechanical response may be affected by one or more of a temperature T of the battery 120; a state of charge SOC of the battery 120; a state of health SOH of the battery 120; one or more dimensions of the battery 120 (for example, as defined by its make and model); an impedance of the battery 120; a mounting configuration of the battery 120 within the portable electronic device 100; and a pressure or constraint applied to the battery 120. Method 200 may thus comprise measuring or recording (as appropriate) one or more of these factors, using a sensor where needed (which could be sensor 130 or an additional sensor), for use in interpreting or analysing the sensor signal (i.e. the detected mechanical response). Such factors may be measured/recorded at the same time as the mechanical response is recorded, and/or in association with that mechanical response.

Taking into account the combination of the controller 110 and the sensor 130, step S4 may comprise measuring the mechanical response of the battery 120 to the measurement signal with the sensor 130. Considering the controller 110 alone, step S4 may comprise obtaining a measurement of the mechanical response of the battery to the measurement signal from the sensor 130 as mentioned earlier, i.e., obtaining the sensor signal from the sensor 130.

As above, the measurement signal is configured to induce a (measurable or detectable) mechanical response of the battery, such as a vibrational response. The measurement signal may also be configured to generate a mechanical response (i.e. test results) suitable for analysing or characterizing the battery, or for detecting a particular battery condition. A frequency spectrum and/or electrical power of the stimulation signal may thus be configured for stimulating the mechanical response.

The measurement signal may be a voltage signal with a peak amplitude between a lower voltage value and an upper voltage value. As an example, the lower voltage value may be between 5 mV and 15 mV, such as 10 mV. The upper voltage value may be between 250 mV and 2 V, such as 500 mV or 1 V. Peak amplitudes may be between 10 mV and 1 V.

The measurement signal may be a current signal with a peak amplitude between a lower current value and an upper current value. As an example, the lower current value may be between 50 mA and 150 mA, such as 100 mA. The upper current value may be between 5 A and 20 A, such as 10 A.

A DC component of the measurement signal may be substantially at 0 V, so that a low or negligible DC charging or discharging current flows in respect of the battery. For example, a DC component of the measurement signal may be configured such that an associated DC charging or discharging current is at or below a tenth or a hundredth of a value which would fully charge/discharge the battery from empty/full within one hour.

Put another way, the DC current into or out of the battery 120 may be limited to below the rate of C/10 during the application of the measurement signal. In this respect, the charge rate (specified for fully re-charging an empty battery) is often referenced to the battery capacity value, represented as C, where the charge capacity of the battery 120 may be understood to be the amount of charge the battery can hold. For example, a cellphone battery which can hold 3.2 Ah (3200 mAh) of charge when fully-charged can in theory (ignoring energy losses etc.) discharge from that state at a rate of 3.2 Amps for one hour before the battery has no usable charge remaining. Charging a battery at "1 C" means the battery can—in theory—be fully re-charged from empty in 1 hour by means of supplying the number of Amps in the charge capacity numeric value. Thus, for the example 3.2 Ah capacity battery, fully charging the battery (cell) at 1.0 C (i.e. from empty) corresponds to charging it (for 1 hour) at a constant charge rate of 3.2 Amps, fully charging it at 2.0 C corresponds to charging it (for 30 minutes) at a constant charge rate of 6.4 Amps, and fully charging it at 0.1 C (or C/10) corresponds to charging it (for 10 hours) at a constant charge rate of 0.32 Amps.

The measurement signal may be configured such that its frequency spectrum is substantially constant over time or is time-varying. The measurement signal may for example have a peak/dominant frequency, where the peak/dominant frequency is selected to at least temporarily stimulate the mechanical response of the battery 120. Such a peak/dominant frequency may be known or configured in advance, for example determined by experimentation on batteries of a specific type. The peak/dominant frequency may be changed over time, so as to effectively test the battery at different frequencies. The measurement signal may have a plurality of peak/dominant frequencies so as to test multiple such frequencies at the same time.

The measurement signal may have a periodic waveform in the time domain. For example, the measurement signal may have a sinusoidal, square or triangular waveform in the time domain. The measurement signal may be a frequency-modulated signal centered at a vibrational response peak (a peak/dominant frequency) and with a bandwidth, the vibrational response peak and the bandwidth selected to stimulate the mechanical response. The bandwidth of the frequency-modulated signal may be similar to that of the vibrational response peak. For example, looking ahead to FIG. 3 which is described later in more detail, if there is for example a vibrational response peak at 11 kHz with a bandwidth of 1 kHz, then the frequency-modulated signal may be centered at approximately 11 kHz and have a bandwidth of approximately 1 kHz. The measurement signal may comprise one or more sinusoidal waveforms with (peak/dominant) frequencies above 10 Hz.

The measurement signal may be configured so that it has one or more different frequency spectrums or peak/dominant frequencies over time and/or so that it has one or more different peak/dominant frequencies at the same time. In such a case, the measurement of the mechanical response of the battery to the measurement signal may be obtained for each of the one or more different frequency spectrums or peak/dominant frequencies. Again, such peak/dominant frequencies may be known or configured in advance, for example determined by experimentation on batteries of a specific type.

In some arrangements, e.g. where the measurement signal is a sinusoidal signal, the method 200 may comprise sweeping or stepping a frequency of the measurement signal between a lower test frequency value and an upper test frequency value and obtaining the measurement of the mechanical response of the battery 120 to the measurement signal for at least a plurality of different values of said frequency as it is swept or stepped. Effectively, the obtained measurement (or test results) may take the form of a frequency response. As an example, the lower test frequency value may be between 500 Hz and 2 kHz, such as 1 kHz. The upper test frequency value may be between 30 kHz and 100 kHz, such as 40 kHz, or between 100 kHz and 300 kHz, such as 200 kHz. Another example frequency range (lower test frequency value to upper test frequency value) may be 4 kHz to 32 kHz. Test frequencies above 10 Hz may be considered. Of course, such stepping or sweeping may be in a single frequency direction (i.e. up or down in frequency), or "randomly walked" (i.e. a plurality of different frequencies may be tested in any order). Also, as above, multiple frequencies could be tested at the same time.

As above, method 200 may comprise step S6. Step S6 comprises analysing the battery, or diagnosing a state of the battery, or characterising the battery based on the measurement of the mechanical response (or the measurement signal and the measurement of the mechanical response), i.e., based on the test results. The sensor signal (mechanical or vibrational response), or a portion thereof, may be stored for processing or analysis. Such analysis may comprise comparing characteristics of the vibrational signal (mechanical response) to known thresholds and making decisions about the battery 120, e.g. its state of health SOH, based on the comparison.

Figure 3:
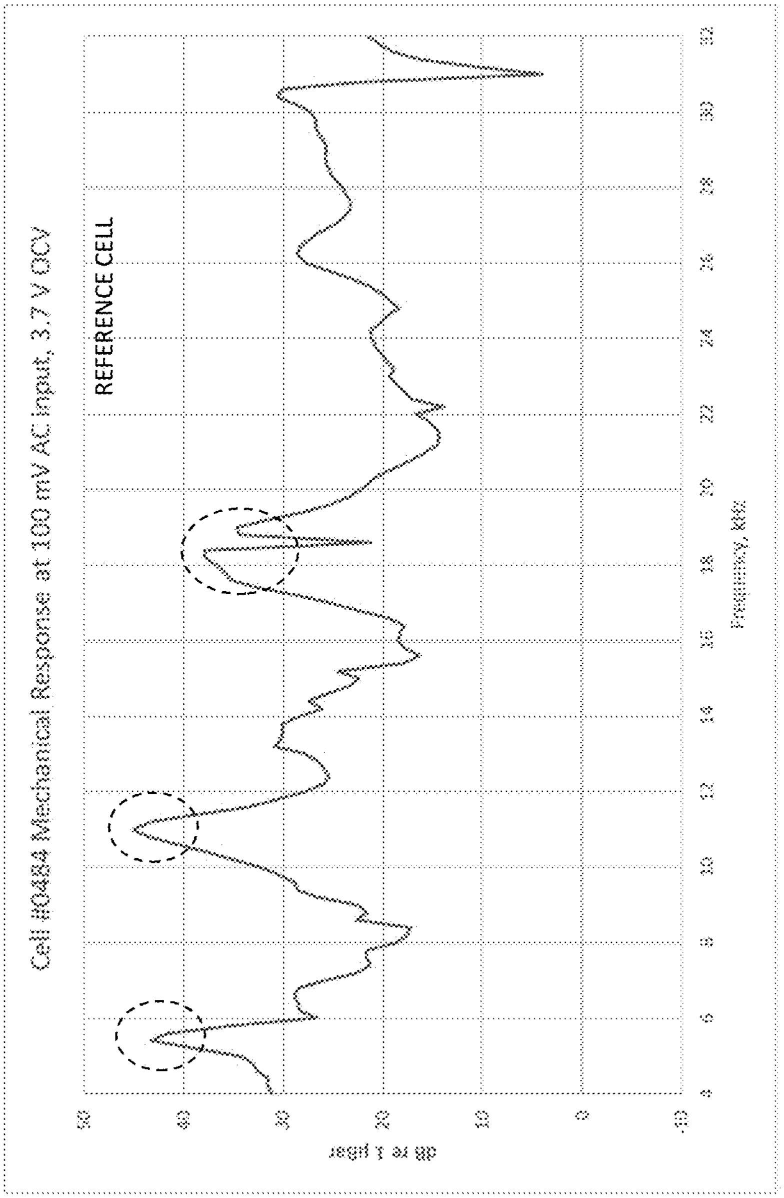
FIG. 3 is a graph showing example test results according to the method of FIG. 2.

FIG. 3 is a graph showing example test results of testing according to method 200 using the portable electronic device 100, in the case of a reference battery 120 (a reference cell), i.e. a battery 120 known to be in "good" condition. Where swelling of the battery 120 is of interest, as a running example, the reference battery may be considered an unswollen or "new" battery.

Figure 4:
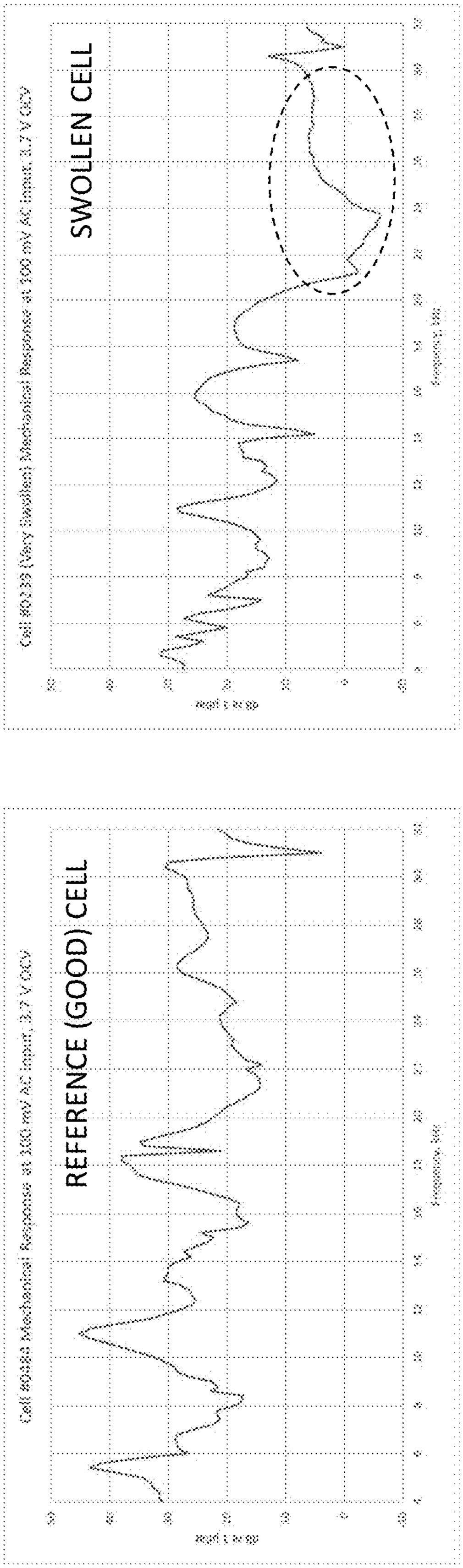
FIG. 4 shows two graphs, indicating different example test results for reference and swollen batteries (cells), respectively.
Figure 5:
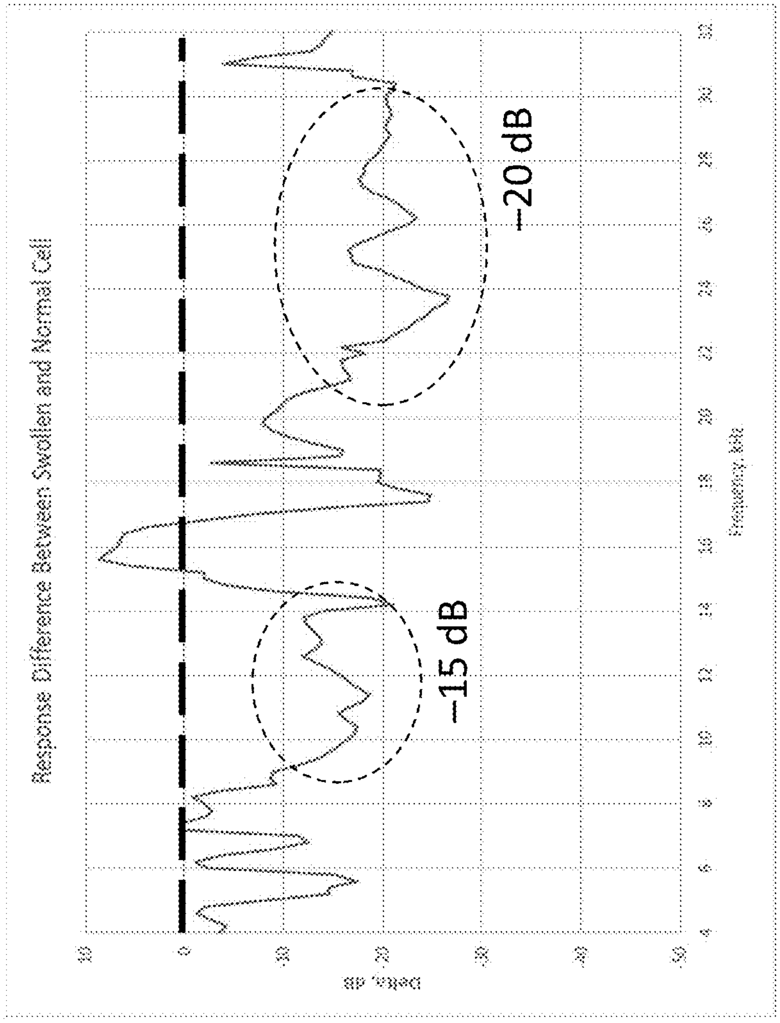
FIG. 5 is a graph showing the difference between the results of the two graphs of FIG. 4.

As mentioned earlier, method 200 could be performed in relation to both a reference battery and known bad/swollen batteries, for comparison purposes. FIG. 4 comprises two graphs side-by-side, the left-hand graph showing the example test results of FIG. 3 and the right-hand graph showing example test results (again, according to method 200 using the portable electronic device 100) in the case of a known bad/swollen battery 120 (a swollen cell) of the same battery type. FIG. 5 is a graph plotting the difference between the results of the two graphs of FIG. 4.

In the graphs of FIGS. 3 and 4, it is assumed that a sinusoidal measurement signal (or other periodic waveform having a peak/dominant frequency) was employed, that the peak/dominant frequency of the measurement signal was swept or stepped between 4 and 32 kHz, in 200 Hz steps, and that the sensor signal received from the sensor 130 was used to plot the magnitude or power of the mechanical response (in decibels relative to 1 uBar set at 0 dB, dB re 1 uBar) as indicated. For FIG. 5 the Y-axis units are decibels, dB, because a difference between two measurements is shown.

Analysing the battery, or diagnosing a state of the battery, or characterising the battery based on the measurement of the mechanical response (or the measurement signal and the measurement of the mechanical response) in step S6 may take various forms.

As an example, a reference battery 120 may be tested to generate measurement thresholds for diagnostic purposes. As ringed in FIG. 3, the position of peaks in the frequency response (or mechanical response vs frequency plot) may be identified, and these may be recorded as indicative of a frequency profile of the battery 120 under test or used to generate such measurement thresholds for diagnostic purposes (or even for battery treatment purposes). For example, the peaks may identify frequencies at which the battery may be deliberately vibrated in an efficient manner or serve as a signature based on which the type of battery (e.g. make and/or model) may be identified. For example, the peaks may be related to the physical dimensions and construction of a cell/battery. The position of peaks in the frequency response may be compared against reference values, or, in the specific case of FIG. 3 (where a reference battery/cell is under test), used to generate such reference values.

It will be appreciated that it is not necessary to generate a full frequency response as indicated in FIG. 3; instead, power values at one or more discrete frequencies may be measured (using measurement signals having such peak/dominant frequencies), such as at the frequencies where the peaks appear in FIG. 3. Similar considerations apply also to FIGS. 4 and 5, where measurements at frequencies of interest may be made, rather than over a full frequency sweep.

Looking at FIG. 4, it may be that a swollen/bad battery (or cell) generates a significantly lower response compared to that of a healthy or good battery cell. A level of difference between bad and good cells can be appreciated, and an example frequency range where such a difference occurs is ringed in FIG. 4 (with similar frequency ranges of difference also highlighted in FIG. 5). The mechanism behind the swelling may comprise outgassing, causing delamination of cell layers, with the delamination interfering with transmission of vibrational energy to the cell surface or pouch.

The mechanical (or electromechanical) response of a battery 120 in the field, e.g. in the portable electronic device 100, may be periodically measured by performing steps S2 and S4 of method 200. If the mechanical response falls below a given threshold (e.g. set to distinguish the two graphs of FIG. 4 from one another), for example at a given frequency or over a given frequency range, then it may be determined that the battery 120 is a bad/swollen battery. It is recalled that testing may be conducted at one or more test frequencies, or over one or more test frequency ranges, with one or more corresponding thresholds then being employed in the analysis.

Where the mechanical response of a battery 120 in the field is periodically measured (e.g. from time to time), differences in mechanical response may be identified between those measurements rather than between each measurement and one or more reference thresholds. As an alternative, such reference thresholds as applied to a given measurement may be determined from one or more preceding measurements.

In general terms, therefore, step S6 may comprise diagnosing a state of the battery 120, or characterising the battery 120, based on a relationship between the frequency spectrum or peak/dominant frequency or frequency of the measurement signal and the corresponding measured mechanical response. The relationship may be a measured relationship, and step S6 may comprise comparing the measured relationship with a corresponding reference relationship (e.g. for a reference battery), and diagnosing the state of the battery, or characterising the battery, based on the comparison. The comparison may involve finding a difference between the measured relationship and the reference relationship, for example as shown in FIG. 5. Significant differences, i.e. differences greater than a corresponding defined threshold, may indicate that the battery 120 is a bad/swollen battery, as indicated. Such indicative differences may be differences at a particular frequency or over a particular frequency range.

As mentioned earlier, many factors (mechanical-response factors) may affect the mechanical response of the battery 120 to the measurement signal. Example candidates include a temperature T of the battery 120; a state of charge SOC of the battery 120; a state of health SOH of the battery 120; one or more dimensions of the battery 120 (for example, as defined by its make and model); an impedance of the battery 120; a mounting configuration of the battery 120 within the portable electronic device 100; and a pressure or constraint applied to the battery 120.

Method 200 may thus comprise measuring or recording (as appropriate) one or more of these factors, using a sensor where needed (which could be sensor 130 or an additional sensor), for use in interpreting or analysing the sensor signal (i.e. the detected mechanical response). Step S6 may involve employing an algorithm of formula which is a function of one or more of these factors. That is, the method 200 may comprise analysing the battery, or diagnosing a state of the battery, or characterising the battery based on one or more such factors (mechanical-response factors) and the measurement of the mechanical response. For example, different thresholds may apply for different temperatures T or temperature ranges, or different battery makes or models or different battery mounting configurations, and these are of course just examples.

As above, method 200 may comprise step S8. Step S8 comprises generating an alert or setting an operating state of the portable electronic device 100, or outputting another signal, dependent on the diagnosed state of the battery 120.

For example, if it is determined that the battery 120 is a bad/swollen battery, an alert may be generated. Based on such an alert, one or more actions may be taken by the portable electronic device 100. For example, a charge profile or algorithm (used for controlling charging of the battery 120) may be adjusted/altered. As another example, a warning may be presented to a user of the portable electronic device 100 (on a user interface of the device or in another way, such as by transmitting a method to another device) to indicate that the battery is no longer serviceable, or is of the wrong make/model, and needs to be replaced. As another example, the portable electronic device 100 may enter a low power mode or even switch off.

The techniques disclosed herein provide for non-invasive telemetry of battery/cell swelling, as an example battery characteristic of interest. The techniques can be used in-situ in consumer devices, such as cellphones, that do not constrain cells and therefore cannot use force/strain gauges. Potentially dangerous cell swelling, that may not be visible via device case deformation, can be detected in advance of a dangerous situation occurring. The measurement does not affect, and can be performed at any, state of charge SOC of a battery or cell; there is no need to target a specific SOC. Further, the techniques can be carried out using an existing sensor 130 of the portable electronic device 100 (e.g., an accelerometer, multi-axis IMUs, microphone), or via a relatively inexpensive added sensor e.g., a 1-axis MEMS accelerometer.

The controller 110 may be considered battery-testing apparatus for use by the portable electronic device 100 to test the battery 120, the apparatus configured to carry out method 200. Such apparatus may be implemented as a single integrated circuit or as a group of integrated circuits communicatively coupled together.

Figure 6:
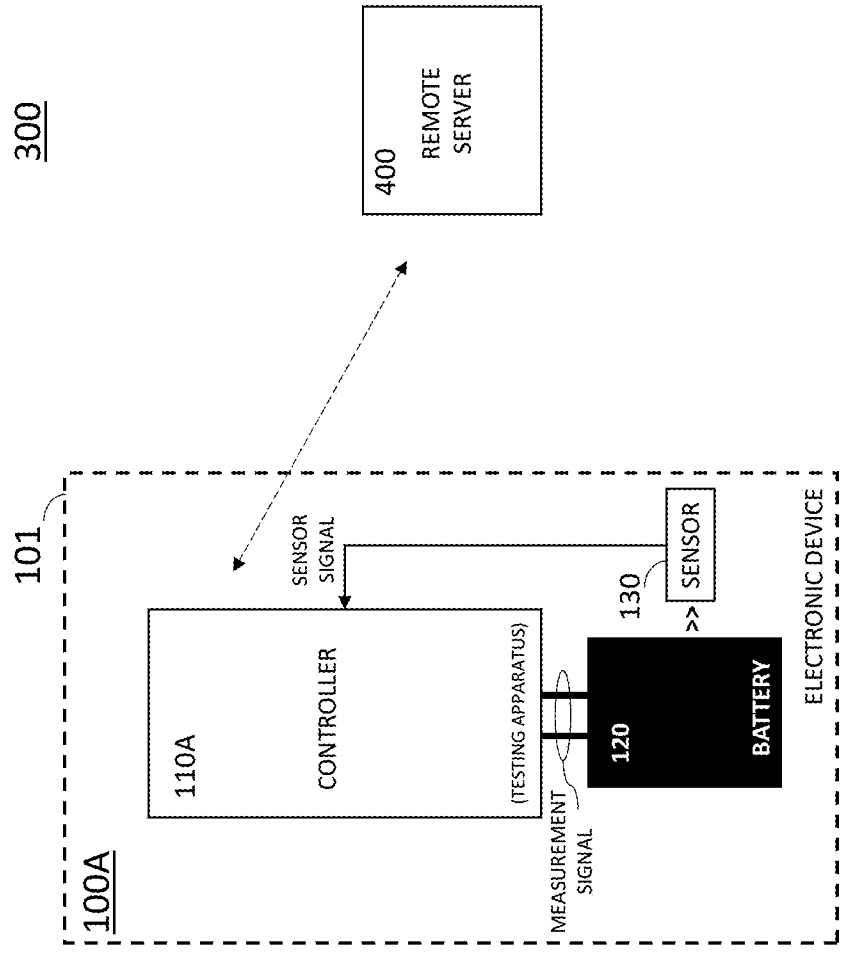
FIG. 6 is a schematic diagram of a system embodying the present invention, comprising a portable electronic device and a remote server.

FIG. 6 is a schematic diagram of a system 300, embodying the present invention, comprising a portable electronic device 100B and a remote server (remote computing apparatus) 400. The remote server 400 may be communicatively coupled to the portable electronic device 100B, for example via a network, over wired or wireless communication links. The portable electronic device 100A, itself embodying the present invention, may be considered a variation of the portable electronic device 100. The remove server 300 may itself embody the present invention.

Portable electronic device 100A is generally the same as portable electronic device 100, except that controller 110 is replaced with a variant controller 110A. As such, duplicate description is omitted. In overview, the functionality of the controller (testing apparatus) 110 may be distributed between the controller 110A and the remote server 400. That is, the combination of the controller 110A and the remote server 300 may be considered testing apparatus corresponding to controller 110. Method 200 may be implemented in the system 300, i.e. by the portable electronic device 100A (in particular, controller 110A) in combination with the remote server 400.

Control functionality of the remote server 300 may be implemented as digital or analogue circuitry, in hardware or in software running on a processor, or in any combination of these. Such control functionality may include any system, device, or apparatus configured to interpret and/or execute program instructions or code and/or process data, and may include, without limitation a processor, microprocessor, microcontroller, digital signal processor (DSP), application specific integrated circuit (ASIC), FPGA (Field Programmable Gate Array) or any other digital or analogue circuitry configured to interpret and/or execute program instructions and/or process data. Thus the code may comprise program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware. Processor control code for execution may be provided on a non-volatile carrier medium such as a disk, CD- or DVD-ROM, programmed memory such as read only memory (Firmware), or on a data carrier such as an optical or electrical signal carrier. Such control circuitry and may be provided as, or as part of, an integrated circuit such as an IC chip.

In an example, step S6 and optionally also step S8 may be carried out in the server 400. That is, in some arrangements the measurement results of step S4 (i.e. based on the sensor signal from the sensor 130), and optionally also details of the measurement signal of step S2 (and any other mechanical-response factors as mentioned earlier), may be provided to the server 400, based on which the server may carry out step S6, or steps S6 and S8.

Of course, steps S6 and S8 may be split/divided between the controller 110A and server 400 in another way. For example, step S6 may be carried out in the server 400 and step S8 may be carried out in the controller 110A, or vice versa, with appropriate communication between the server 400 and the controller 110A.

In some arrangements, the testing apparatus of FIG. 1 or FIG. 6 may be provided separately from other components of the portable electronic device or system concerned. Such testing apparatus, for use by a portable electronic device such as device 100 or 100A, may be configured to carry out any of the methods disclosed herein, such as method 200 (or steps thereof). Such testing apparatus may be implemented as a single integrated circuit or as a group of integrated circuits.

The battery 120, as mentioned above, may comprise a battery cell and/or may be a single-cell battery. The battery 120 may comprise a plurality of battery cells. The battery 120 may be a commercially available battery, or consumer battery, or customer-ready battery or end-user-ready battery. The battery 120 may be a pouch cell or prismatic cell battery. The portable electronic devices disclosed herein may be considered a handheld portable electronic device and/or a mobile electronic device. The portable electronic devices disclosed herein may be considered a consumer device. The skilled person will appreciate that references to a portable electronic device herein could be replaced with references to an electrical or electronic device or system or to a mobile electrical or electronic device or system. Examples of such electronic devices may include cellphones, laptops, tablet computers, wearable electronic devices, power tools, and computing apparatus.

As an example use case, there may be provided a system for detecting and measuring in-situ a rechargeable cell vibrational response to an electrical stimulus, the system comprising a rechargeable cell, an electrical component generating a varying electrical signal at the terminal(s) of the cell, at least one sensor capable of sensing vibrations generated in the cell by the varying electrical signal, said sensor being substantially coupled to the cell, and a component capable of receiving and processing the output of the sensor.

As another example use case, there may be provided a method for detecting and measuring in-situ a rechargeable cell vibrational response to an electrical stimulus, the method comprising generating a variable electrical signal at at least one terminal of a rechargeable cell to generate mechanical vibrations within the cell, acquiring a signal from a sensor substantially coupled to the cell, both the cell and the sensor located within a common housing generating a measurement of the vibrational response to the electrical signal.

The skilled person will recognise that some aspects of the above-described apparatus (circuitry), devices and methods may be embodied as processor control code, for example on a non-volatile carrier medium such as a disk, CD- or DVD-ROM, programmed memory such as read only memory (Firmware), or on a data carrier such as an optical or electrical signal carrier. For example, any of controllers 110 and 110A and server 400 may be implemented as a processor operating based on processor control code.

For some applications, such aspects will be implemented on a DSP (Digital Signal Processor), ASIC (Application Specific Integrated Circuit) or FPGA (Field Programmable Gate Array). Thus the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element. Further embodiments likewise, with the benefit of this disclosure, will be apparent to those having ordinary skill in the art, and such embodiments should be deemed as being encompassed herein.

To aid the Patent Office (USPTO) and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The present disclosure extends to the following statements:

S1. A method of testing a battery of a portable electronic device, the method implemented by the portable electronic device or battery-testing apparatus thereof, the method comprising:
- applying a measurement signal to at least one terminal of the battery, wherein the measurement signal is a fluctuating or alternating electrical signal; and
- obtaining a measurement of a mechanical response of the battery to the measurement signal from a sensor.

S2. The method of statement S1, wherein the method comprises analysing the battery, or diagnosing a state of the battery, or characterising the battery based on:
- the measurement of the mechanical response; or
- the measurement signal and the measurement of the mechanical response.

S3. The method of statement S1 or S2, wherein the mechanical response is a mechanical response of electrodes of the battery.

S4. The method of any of the preceding statements, wherein the mechanical response is a vibrational response.

S5. The method of any of the preceding statements, wherein the measurement signal is configured to induce a fluctuating or alternating electric field between electrodes of the battery.

S6. The method of any of the preceding statements, wherein the measurement signal is configured to induce a fluctuating or alternating potential difference across the terminals of the battery.

S7. The method of any of the preceding statements, wherein a frequency spectrum and/or electrical power of the measurement signal is configured for stimulating the mechanical response.

S8. The method of any of the preceding statements, wherein the measurement signal is:
- an AC signal; and/or
- a voltage signal or a current signal.

S9. The method of any of the preceding statements, wherein a DC component of the measurement signal is:
- substantially at 0 V; and/or
- at or below a tenth or a hundredth of a value which would cause a charging current to flow which would charge the battery from empty within one hour; and/or
- at or below a tenth or a hundredth of a value which would cause a discharging current to flow which would empty the battery from full within one hour.

S10. The method of any of the preceding statements, wherein the measurement signal is a voltage signal with a peak amplitude between a lower voltage value and an upper voltage value, optionally wherein:
- the lower voltage value is between 5 mV and 15 mV, such as 10 mV; and/or
- the upper voltage value is between 250 mV and 2 V, such as 500 mV or 1 V.

S11. The method of any of the preceding statements, wherein the measurement signal is a current signal with a peak amplitude between a lower current value and an upper current value, optionally wherein:
- the lower current value is between 50 mA and 150 mA, such as 100 mA; and/or
- the upper current value is between 5 A and 20 A, such as 10 A.

S12. The method of any of the preceding statements, wherein the method comprises generating the measurement signal.

S13. The method of any of the preceding statements, wherein the measurement signal is configured such that its frequency spectrum is substantially constant over time or is time-varying.

S14. The method of any of the preceding statements, wherein the measurement signal has a peak/dominant frequency, and wherein the peak/dominant frequency is selected or controlled to at least temporarily stimulate said mechanical response.

S15. The method of any of the preceding statements, wherein the measurement signal has a periodic waveform in the time domain.

S16. The method of any of the preceding statements, wherein:

the stimulation signal has a sinusoidal, square or triangular waveform in the time domain; and/or is a frequency-modulated signal centered at a vibrational response peak and with a bandwidth, the vibrational response peak and the bandwidth selected or controlled to stimulate said mechanical response, optionally wherein the bandwidth is substantially similar to that of the vibrational response peak.

S17. The method of any of the preceding statements, wherein the method comprises measuring the mechanical response of the battery to the measurement signal with the sensor.

S18. The method of any of the preceding statements, wherein the sensor is a sensor of the portable electronic device.

S19. The method of any of the preceding statements, wherein the sensor comprises at least one of:

a microphone;

an accelerometer;

an inertial measurement unit;

a motion sensor;

a speaker;

a piezoelectric sensor;

a force sensor;

a virtual button implemented by a force sensor; and an electromechanical actuator such as an LRA.

S20. The method of any of the preceding statements, wherein the method comprises, in association with the measurement of the mechanical response of the battery, measuring or recording one or more mechanical-response factors, the one or more mechanical-response factors comprising at least one of:

a temperature T of the battery;

a state of charge SOC of the battery;

a state of health SOH of the battery;

one or more dimensions of the battery;

an impedance of the battery;

a mounting configuration of the battery within the portable electronic device; and a pressure or constraint applied to the battery.

S21. The method of statement S20, wherein the method comprises analysing the battery, or diagnosing a state of the battery, or characterising the battery based on the one or more mechanical-response factors and the measurement of the mechanical response.

S22. The method of any of the preceding statements, wherein the method comprises obtaining the measurement of the mechanical response of the battery to the measurement signal while applying the measurement signal.

S23. The method of any of the preceding statements, wherein the method comprises:

configuring the measurement signal so that it has one or more different frequency spectra or peak/dominant frequencies over time and/or so that it has one or more different peak/dominant frequencies at the same time; and obtaining the measurement of the mechanical response of the battery to the measurement signal for each of said one or more different frequency spectra or peak/dominant frequencies.

S24. The method of any of the preceding statements, wherein:

the measurement signal is a sinusoidal signal; and/or the method comprises sweeping or stepping a frequency of the measurement signal between a lower test frequency value and an upper test frequency value and obtaining the measurement of the mechanical response of the battery to the measurement signal for at least a plurality of different values of said frequency as it is swept or stepped, optionally wherein:

the lower test frequency value is between 500 Hz and 2 kHz, such as 1 kHz; and/or wherein the upper test frequency value is between 100 kHz and 300 kHz, such as 200 kHz.

S25. The method of any of the preceding statements, wherein the method comprises diagnosing a state of the battery, or characterising the battery, based on a relationship between at least one frequency spectrum or peak/dominant frequency or frequency of the measurement signal and the corresponding measured mechanical response.

S26. The method of statement S25, wherein said relationship is a measured relationship, and the method comprises comparing the measured relationship with a corresponding reference relationship for a reference battery, and diagnosing the state of the battery, or characterising the battery, based on the comparison.

S27. The method of statement S26, wherein the comparing comprises finding a difference between the measured relationship and the reference relationship.

S28. The method of any of statements S25 to S27, wherein the method comprises generating an alert or setting an operating state of the portable electronic device dependent on the diagnosed state of the battery.

S29. The method of any of statements S25 to S28, wherein the method comprises adjusting a charging profile or algorithm for controlling charging of the battery dependent on the diagnosed state of the battery.

S30. The method of any of the preceding statements, wherein the measurement signal is applied to the at least one terminal of the battery by battery-analysis apparatus of the portable electronic device.

S31. A method of testing a battery of a portable electronic device, the method implemented by the portable electronic device, the method comprising:

applying a fluctuating or alternating electrical signal to at least one terminal of the battery; and obtaining a measurement of a mechanical response of the battery to the applied signal from a sensor.

S32. A method of testing a battery of a portable electronic device, the method comprising:

applying a measurement signal to at least one terminal of the battery, wherein the measurement signal is a fluctuating or alternating electrical signal; and obtaining a measurement of a mechanical response of the battery to the measurement signal from a sensor.

S33. The method according to any of the preceding statements, wherein:

the battery comprises a battery cell and/or is a single-cell battery; or the battery comprises a plurality of battery cells; or the portable electronic device is a handheld portable electronic device and/or a mobile electronic device.

S34. Battery-testing apparatus for use by a portable electronic device to test a battery of the portable electronic device, the apparatus configured to carry out the method of any of the preceding statements, optionally wherein the apparatus is implemented as a single integrated circuit or as a group of integrated circuits communicatively coupled together.

S35. A portable electronic device comprising the battery-testing apparatus according to statement S34, and optionally comprising the battery.

S36. The portable electronic device of statement S35, being a cellphone, laptop, tablet computer, wearable electronic device, power tool or other personal device.

The present disclosure also extends to the following statements:

A. A system for rechargeable cell diagnostics comprising:

a rechargeable cell;

a component generating an electrical signal at the terminals of the cell;

a vibrational or acoustical sensor substantially coupled to a surface of the cell; and a component capable of receiving and processing the output of the sensor.

B. Preferably, the cell is a li-ion pouch cell.

C. In one aspect, the sensor is an accelerometer.

D. In one aspect, the sensor is coupled to the cell via mechanical linkage provided by structural components of the host device.

E. A method for rechargeable cell diagnostics comprising:

generating a variable electrical signal at least one terminal of a rechargeable cell; acquiring a signal from a sensor substantially coupled to the cell;

comparing characteristics of said signal to known thresholds; and making a decision about the cell's state of health based on the comparison.

F. Preferably, the electrical signals comprise voltage signals with peak amplitudes between 50 mV and 500 mV.

G. Preferably, the electrical signals comprise sinusoidal waveforms with frequencies between 5 kHz and 40 kHz.

H. Preferably, the thresholds are acquired from reference cell measurements.

1. Accordingly, there is provided a diagnostic method for a battery cell comprising the steps of:

Applying a stimulus signal to a battery cell;

Monitoring the electromechanical response of the battery cell to the stimulus; and Determining a diagnostic status of the battery cell based on the monitored response.

2. Preferably, the monitored response is compared against an expected response for a battery cell. The expected response may be selected from a plurality of stored response profiles. The expected response may be selected based on the applied stimulus. The expected response may be based on a response measured from a known healthy battery cell.

3. Preferably, the stimulus signal comprises a time-varying signal, e.g. an AC signal, applied to at least one terminal of the battery cell. Preferably, the stimulus signal comprises voltage signals with peak amplitudes between 50 mV and 500 mV, and/or sinusoidal waveforms with frequencies between 5 kHz and 40 kHz. In some aspects, multiple stimulus signals may be applied to the battery.

4. Preferably, the electromechanical response is monitored using at least one sensor provided at or near the battery cell. The sensor may comprise any suitable device for measuring an electromechanical response, e.g. a strain gauge, an accelerometer.

5. There is further provided a system for performing diagnostics for a battery cell comprising:

a controller coupled with a battery cell and arranged to apply a stimulus signal to the battery cell, and at least one sensor to monitor an electromechanical response of the battery cell to an applied stimulus, the controller arranged to implement the above-described method.

The invention claimed is:

1. A method of testing a battery of a portable electronic device, the method implemented by the portable electronic device or battery-testing apparatus thereof, the method comprising:

applying a measurement signal to at least one terminal of the battery, wherein the measurement signal is a fluctuating or alternating electrical signal;

obtaining a measurement of a mechanical response of the battery to the measurement signal from a sensor;

diagnosing a state of the battery based on a relationship between at least one frequency spectrum or peak/dominant frequency or frequency of the measurement signal and the corresponding measured mechanical response; and dependent on the diagnosed state of the battery:

adjusting a charging profile or algorithm for controlling charging of the battery dependent on the diagnosed state of the battery; or generating an alert or setting an operating state of the portable electronic device.

2. The method of claim 1, wherein the method comprises analysing the battery, or diagnosing a state of the battery, or characterising the battery based on:

the measurement of the mechanical response; or the measurement signal and the measurement of the mechanical response.

3. The method of claim 1, wherein the mechanical response is a vibrational response.

4. The method of claim 1, wherein the measurement signal is configured to induce a fluctuating or alternating electric field between electrodes of the battery.

5. The method of claim 1, wherein a frequency spectrum and/or electrical power of the measurement signal is configured for stimulating the mechanical response.

6. The method of claim 1, wherein the measurement signal is:

an AC signal; and/or a voltage signal or a current signal.

7. The method of claim 1, wherein a DC component of the measurement signal is:

substantially at 0 V; and/or at or below a tenth or a hundredth of a value which would cause a charging current to flow which would charge the battery from empty within one hour; and/or at or below a tenth or a hundredth of a value which would cause a discharging current to flow which would empty the battery from full within one hour.

8. The method of claim 1, wherein the measurement signal is a voltage signal with a peak amplitude between a lower voltage value and an upper voltage value, optionally wherein:

the lower voltage value is between 5 mV and 15 mV, such as 10 mV; and/or the upper voltage value is between 250 mV and 2 V, such as 500 mV or 1 V.

9. The method of claim 1, wherein the measurement signal is a current signal with a peak amplitude between a lower current value and an upper current value, optionally wherein:

the lower current value is between 50 mA and 150 mA, such as 100 mA; and/or the upper current value is between 5 A and 20 A, such as 10 A.

10. The method of claim 1, wherein the measurement signal is configured such that its frequency spectrum is substantially constant over time or is time-varying.

11. The method of claim 1, wherein the measurement signal has a peak/dominant frequency, and wherein the peak/dominant frequency is selected or controlled to at least temporarily stimulate said mechanical response.

12. The method of claim 1, wherein the measurement signal has a periodic waveform in the time domain.

13. The method of claim 1, wherein the method comprises, in association with the measurement of the mechanical response of the battery, measuring or recording one or more mechanical-response factors, the one or more mechanical-response factors comprising at least one of:

a temperature T of the battery;

a state of charge SOC of the battery;

a state of health SOH of the battery;

one or more dimensions of the battery;

an impedance of the battery;

a mounting configuration of the battery within the portable electronic device; and a pressure or constraint applied to the battery, wherein the method comprises analysing the battery, or diagnosing a state of the battery, or characterising the battery based on the one or more mechanical-response factors and the measurement of the mechanical response.

14. The method of claim 1, wherein the method comprises:

configuring the measurement signal so that it has one or more different frequency spectra or peak/dominant frequencies over time and/or so that it has one or more different peak/dominant frequencies at the same time; and obtaining the measurement of the mechanical response of the battery to the measurement signal for each of said one or more different frequency spectra or peak/dominant frequencies.

15. The method of claim 1, wherein said relationship is a measured relationship, and the method comprises comparing the measured relationship with a corresponding reference relationship for a reference battery, and diagnosing the state of the battery, or characterising the battery, based on the comparison.

16. Battery-testing apparatus for use by a portable electronic device to test a battery of the portable electronic device, the apparatus configured to carry out the method of claim 1, optionally wherein the apparatus is implemented as a single integrated circuit or as a group of integrated circuits communicatively coupled together.

17. A portable electronic device comprising the battery-testing apparatus according to claim 16, and optionally comprising the battery.

18. The method of claim 1, comprising:

in association with the measurement of the mechanical response, measuring or recording a temperature of the battery; and diagnosing the state of the battery based on the measured temperature and the measurement of the mechanical response.

* * * * *